(12) United States Patent
Sharp

(10) Patent No.: US 11,249,355 B2
(45) Date of Patent: Feb. 15, 2022

(54) COLOR SWITCH FOR REDUCED COLOR CROSS-TALK

(71) Applicant: Gary D. Sharp, Boulder, CO (US)

(72) Inventor: Gary D. Sharp, Boulder, CO (US)

(73) Assignee: GARY SHARP INNOVATIONS, LLC, Boulder, CO (US)

( * ) Notice: Subject to any disclaimer, the term of this patent is extended or adjusted under 35 U.S.C. 154(b) by 62 days.

(21) Appl. No.: 16/260,934

(22) Filed: Jan. 29, 2019

(65) Prior Publication Data

US 2019/0235300 A1 Aug. 1, 2019

Related U.S. Application Data

(60) Provisional application No. 62/623,484, filed on Jan. 29, 2018.

(51) Int. Cl.

| | |
|---|---|
| *G02F 1/1347* | (2006.01) |
| *G02B 27/28* | (2006.01) |
| *H04N 9/04* | (2006.01) |
| *G02B 5/30* | (2006.01) |
| *H01L 27/146* | (2006.01) |
| *G02F 1/01* | (2006.01) |
| *G02F 1/13363* | (2006.01) |

(52) U.S. Cl.
CPC ....... *G02F 1/13473* (2013.01); *G02B 5/3083* (2013.01); *G02B 27/288* (2013.01); *G02F 1/0136* (2013.01); *G02F 1/13363* (2013.01); *H04N 9/04521* (2018.08); *G02F 1/133637* (2021.01); *H01L 27/14621* (2013.01)

(58) Field of Classification Search
CPC ............... G02F 1/13473; G02F 1/0136; G02F 1/13363; G02F 1/133637; G02B 27/288; G02B 5/3083; H01L 27/14621; H04N 9/04521
See application file for complete search history.

(56) References Cited

U.S. PATENT DOCUMENTS

| | | | |
|---|---|---|---|
| 4,511,225 A | 4/1985 | Lipson | |
| 4,726,663 A * | 2/1988 | Buzak | ............... G02F 1/133509 345/88 |
| 4,884,876 A | 12/1989 | Lipton | |
| 5,132,826 A | 7/1992 | Johnson et al. | |
| 5,231,521 A | 7/1993 | Johnson et al. | |
| 5,243,455 A | 9/1993 | Johnson et al. | |

(Continued)

*Primary Examiner* — Jessica M Merlin
*Assistant Examiner* — Mark D Teets
(74) *Attorney, Agent, or Firm* — Robert G. Crouch

(57) ABSTRACT

A liquid-crystal based color switch for use with an image sensor having sub-diffraction-limited (SDL) pixels. The color switch may switch between a first mode where green light is passed (and blue and red light is blocked) and a second mode where blue and red light is passed (and green light is blocked). The color switch may include an achromatic switch (such as a liquid crystal switch) and retarder stack filter that are both sandwiched between a first and a second polarizer. The SDL pixels may be distributed so that green subpixels are never adjacent to other green subpixels in the same row or column, so that red subpixels are always adjacent to green subpixels in the same row or column, and so that blue subpixels are always adjacent to green subpixels in the same row or column.

18 Claims, 5 Drawing Sheets

(56) References Cited

U.S. PATENT DOCUMENTS

| | | |
|---|---|---|
| 5,347,378 A * | 9/1994 | Handschy ............ G02F 1/13473 349/102 |
| 5,381,253 A | 1/1995 | Sharp et al. |
| 5,387,958 A | 2/1995 | Pashley |
| 5,493,426 A | 2/1996 | Johnson et al. |
| 5,528,393 A | 6/1996 | Sharp et al. |
| 5,552,912 A | 9/1996 | Sharp et al. |
| 5,574,553 A | 11/1996 | McManamon et al. |
| 5,619,355 A | 4/1997 | Sharp et al. |
| 5,627,666 A | 5/1997 | Sharp et al. |
| 5,658,490 A | 8/1997 | Sharp et al. |
| 5,689,317 A | 11/1997 | Miller |
| 5,715,023 A | 2/1998 | Hoppe |
| 5,751,384 A * | 5/1998 | Sharp .................. G02B 27/288 349/18 |
| 5,781,268 A | 7/1998 | Lin et al. |
| 5,822,021 A | 10/1998 | Johnson et al. |
| 5,870,159 A | 2/1999 | Sharp |
| 5,892,559 A | 4/1999 | Sharp |
| 5,892,612 A | 4/1999 | Miller |
| 5,929,946 A | 7/1999 | Sharp et al. |
| 5,953,083 A | 9/1999 | Sharp |
| 5,990,996 A * | 11/1999 | Sharp .................. G02F 1/0136 348/E5.133 |
| 5,999,240 A | 12/1999 | Sharp et al. |
| 6,028,656 A | 2/2000 | Buhrer |
| 6,046,786 A | 4/2000 | Sharp et al. |
| 6,049,367 A | 4/2000 | Sharp et al. |
| 6,075,651 A | 6/2000 | Hoppe |
| 6,078,374 A | 6/2000 | Sharp et al. |
| 6,091,462 A | 7/2000 | Sharp et al. |
| 6,097,461 A | 8/2000 | Sharp |
| 6,141,069 A | 10/2000 | Sharp et al. |
| 6,141,071 A | 10/2000 | Sharp |
| 6,172,722 B1 | 1/2001 | Sharp |
| 6,183,091 B1 | 2/2001 | Johnson et al. |
| 6,252,638 B1 | 6/2001 | Johnson et al. |
| 6,273,571 B1 | 8/2001 | Sharp et al. |
| 6,310,673 B1 | 10/2001 | Sharp |
| 6,380,997 B1 | 4/2002 | Sharp et al. |
| 6,417,892 B1 | 7/2002 | Sharp et al. |
| 6,452,646 B1 | 9/2002 | Sharp et al. |
| 6,638,583 B1 | 10/2003 | Sharp et al. |
| 6,650,377 B2 | 11/2003 | Robinson et al. |
| 6,667,784 B2 | 12/2003 | Sharp et al. |
| 6,704,065 B1 | 3/2004 | Sharp et al. |
| 6,707,516 B1 | 3/2004 | Johnson et al. |
| 6,735,017 B1 | 5/2004 | Acosta |
| 6,816,309 B2 | 11/2004 | Chen et al. |
| 6,882,384 B1 | 4/2005 | Sharp |
| 6,899,430 B2 | 5/2005 | Johnson et al. |
| 6,922,221 B2 | 7/2005 | Zhu |
| 6,961,179 B2 | 11/2005 | Chen et al. |
| 6,961,181 B2 | 11/2005 | Chen et al. |
| 7,002,752 B2 | 2/2006 | Chen et al. |
| 7,083,282 B1 | 8/2006 | Sharp et al. |
| 7,106,509 B2 | 9/2006 | Sharp |
| 7,126,649 B2 | 10/2006 | Chen et al. |
| 7,154,667 B2 | 12/2006 | Birge et al. |
| 7,195,356 B1 | 3/2007 | Sharp |
| 7,298,386 B1 | 11/2007 | Sharp et al. |
| 7,345,723 B2 | 3/2008 | Robinson et al. |
| 7,436,476 B2 | 10/2008 | Sharp et al. |
| 7,510,280 B2 | 3/2009 | Sharp |
| 7,511,787 B2 | 3/2009 | Sharp |
| 7,528,906 B2 | 5/2009 | Robinson et al. |
| 7,545,469 B2 | 6/2009 | Robinson et al. |
| 7,583,439 B2 | 9/2009 | Tsai |
| 7,692,746 B2 | 4/2010 | Sharp |
| 7,898,603 B2 | 3/2011 | Sharp |
| 7,898,734 B2 | 3/2011 | Coleman et al. |
| 7,905,602 B2 | 3/2011 | Schuck et al. |
| 8,004,758 B2 | 8/2011 | Coleman et al. |
| 8,072,681 B2 | 12/2011 | Coleman et al. |
| 8,085,644 B2 | 12/2011 | Sharp |
| 8,169,699 B2 | 5/2012 | Petersen et al. |
| 8,184,215 B2 | 5/2012 | Osterman et al. |
| 8,194,315 B2 | 6/2012 | Sharp et al. |
| 8,220,934 B2 | 7/2012 | Schuck et al. |
| 8,233,034 B2 | 7/2012 | Sharp et al. |
| 8,328,362 B2 | 12/2012 | Coleman et al. |
| 8,330,911 B2 | 12/2012 | Hong |
| 8,403,488 B2 | 3/2013 | Schuck et al. |
| 8,408,708 B2 | 4/2013 | Sharp |
| 8,425,041 B2 | 4/2013 | Schuck et al. |
| 8,427,394 B2 | 4/2013 | Sharp et al. |
| 8,488,240 B2 | 7/2013 | Petersen et al. |
| 8,526,106 B2 | 9/2013 | Coleman |
| 8,540,372 B2 | 9/2013 | Coleman |
| 8,630,037 B1 | 1/2014 | Osterman |
| 8,638,400 B2 | 1/2014 | Sharp |
| 8,659,828 B2 | 2/2014 | Sharp |
| 8,687,275 B2 | 4/2014 | Coleman |
| 8,711,477 B2 | 4/2014 | Coleman |
| 8,724,218 B2 | 5/2014 | Curtis |
| 8,727,536 B2 | 5/2014 | Schuck |
| 8,746,876 B2 | 6/2014 | Sharp |
| 8,757,806 B2 | 6/2014 | Schuck |
| 8,760,760 B2 | 6/2014 | Coleman |
| 8,794,764 B2 | 8/2014 | Schuck |
| 8,820,937 B2 | 9/2014 | Osterman et al. |
| 8,833,943 B2 | 9/2014 | Schuck |
| 8,851,680 B2 | 10/2014 | Sharp |
| 8,891,042 B1 | 11/2014 | Osterman et al. |
| 8,908,081 B2 | 12/2014 | Davis |
| 8,941,801 B2 | 1/2015 | Robinson |
| 9,046,755 B2 | 6/2015 | Sharp |
| 9,057,880 B2 | 6/2015 | Curtis |
| 9,086,578 B2 | 7/2015 | Curtis |
| 9,110,363 B2 | 8/2015 | Petersen |
| 9,121,999 B2 | 9/2015 | Yan |
| 9,146,454 B2 | 9/2015 | Coleman |
| 9,167,236 B2 | 10/2015 | Sharp |
| 9,223,142 B2 | 12/2015 | Schuck |
| 9,229,139 B2 | 1/2016 | Osterman et al. |
| 9,235,057 B2 | 1/2016 | Robinson |
| 9,310,618 B2 | 4/2016 | Curtis |
| 9,316,865 B2 | 4/2016 | Osterman et al. |
| 9,350,980 B2 | 5/2016 | Robinson |
| 9,380,220 B2 | 6/2016 | Davis |
| 9,383,590 B2 | 7/2016 | Sharp |
| 9,457,523 B2 | 10/2016 | Coleman |
| 9,459,463 B2 | 10/2016 | Sharp |
| 9,530,397 B2 | 12/2016 | Sharp |
| 9,554,125 B2 | 1/2017 | Schuck |
| 9,594,298 B2 | 3/2017 | Schuck |
| 9,618,765 B2 | 4/2017 | Sharp |
| 9,625,745 B2 | 4/2017 | Sharp |
| 9,664,945 B2 | 5/2017 | Liu |
| 9,680,132 B1 | 6/2017 | Tsai |
| 9,686,474 B2 | 6/2017 | Davis |
| 9,709,883 B2 | 7/2017 | Sharp |
| 9,740,016 B2 | 8/2017 | Schuck |
| 9,823,561 B2 | 11/2017 | Sharp |
| 9,854,180 B2 | 12/2017 | Davis |
| 9,910,207 B2 | 3/2018 | Robinson |
| 9,933,631 B2 | 4/2018 | Osterman et al. |
| 9,933,636 B2 | 4/2018 | Sharp |
| 9,946,088 B2 | 4/2018 | Robinson |
| 10,012,884 B2 | 7/2018 | Osterman et al. |
| 10,049,627 B2 | 8/2018 | Schuck |
| 10,054,851 B2 | 8/2018 | Sharp |
| 10,082,675 B2 | 9/2018 | Sharp |
| 10,129,484 B2 | 11/2018 | Davis |
| 10,187,588 B2 | 1/2019 | Davis |
| 10,203,511 B2 | 2/2019 | Schuck |
| 10,393,946 B2 | 8/2019 | Robinson |
| 10,394,040 B2 | 8/2019 | Gollier |
| 10,401,700 B2 | 9/2019 | Osterman et al. |
| 10,416,461 B2 | 9/2019 | Gollier |
| 10,474,229 B1 | 11/2019 | Collier |
| 10,495,798 B1 | 12/2019 | Peng |
| 10,502,981 B2 | 12/2019 | Sharp |
| 10,520,772 B1 | 12/2019 | Lu |

(56) References Cited

U.S. PATENT DOCUMENTS

| | | | |
|---|---|---|---|
| 10,539,829 B1 | 1/2020 | Lu | |
| 10,545,348 B1 | 1/2020 | Lu | |
| 10,571,719 B1 | 2/2020 | McCabe | |
| 10,598,928 B1 | 3/2020 | Lam | |
| 10,598,945 B1 | 3/2020 | Lu | |
| 10,600,352 B1 | 3/2020 | Wheelwright | |
| 10,609,364 B2 | 3/2020 | Geng | |
| 10,614,767 B2 | 4/2020 | Sharp | |
| 10,630,908 B2 | 4/2020 | Davis | |
| 10,642,048 B2 | 5/2020 | Peng | |
| 10,670,861 B2 | 6/2020 | Gollier | |
| 10,670,928 B2 | 6/2020 | Shi | |
| 10,678,057 B2 | 6/2020 | Lu | |
| 10,678,116 B1 | 6/2020 | Lam | |
| 10,690,930 B1 | 6/2020 | Lu | |
| 10,691,198 B1 | 6/2020 | Gollier | |
| 10,705,401 B1 | 7/2020 | Lu | |
| 10,712,485 B1 | 7/2020 | Lam | |
| 10,739,611 B2 | 8/2020 | Sharp | |
| 10,739,651 B2 | 8/2020 | Sharp | |
| 10,809,585 B1 | 10/2020 | Lu | |
| 10,838,214 B2 | 11/2020 | Chen | |
| 10,839,609 B2 | 11/2020 | Sears | |
| 10,845,597 B1 | 11/2020 | Gollier | |
| 10,866,429 B2 | 12/2020 | Sharp | |
| 10,871,653 B1 | 12/2020 | Osterman et al. | |
| 10,890,823 B1 | 1/2021 | Jiang | |
| 10,895,675 B2 | 1/2021 | Sharp | |
| 10,901,205 B1 | 1/2021 | Lu | |
| 10,902,820 B2 | 1/2021 | Peng | |
| 10,914,953 B1 | 2/2021 | Lam | |
| 10,928,698 B2 | 2/2021 | Osterman et al. | |
| 10,934,381 B2 | 3/2021 | Lu | |
| 10,935,790 B2 | 3/2021 | Lu | |
| 10,935,804 B1 | 3/2021 | Lu | |
| 2005/0099373 A1* | 5/2005 | Funfschilling | G02B 5/3016 345/87 |
| 2008/0198456 A1* | 8/2008 | Sharp | G02F 1/13363 359/489.07 |
| 2013/0293751 A1* | 11/2013 | Vaartstra | H01L 31/18 348/280 |
| 2014/0078459 A1* | 3/2014 | Kim | G02F 1/13475 349/193 |
| 2016/0109730 A1 | 4/2016 | McDowall | |
| 2016/0127661 A1* | 5/2016 | Hegyi | G01J 3/0229 348/164 |
| 2018/0039004 A1 | 2/2018 | Yun | |
| 2018/0039052 A1 | 2/2018 | Khan | |
| 2018/0210223 A1 | 7/2018 | Sharp et al. | |
| 2018/0227550 A1* | 8/2018 | Fossum | H04N 9/04 |
| 2018/0259692 A1 | 9/2018 | Sharp | |
| 2019/0018177 A1* | 1/2019 | Sharp | G02B 5/3083 |
| 2019/0235145 A1 | 8/2019 | Sharp | |
| 2019/0235300 A1 | 8/2019 | Sharp | |
| 2019/0265467 A1 | 8/2019 | Yun | |
| 2019/0271853 A1 | 9/2019 | Sharp | |
| 2019/0302479 A1 | 10/2019 | Smyth | |
| 2019/0353948 A1* | 11/2019 | Sharp | G02F 1/139 |
| 2019/0377176 A1 | 12/2019 | Sharp | |
| 2019/0377182 A1 | 12/2019 | Sharp | |
| 2019/0377183 A1 | 12/2019 | Sharp | |
| 2019/0377184 A1 | 12/2019 | Sharp | |
| 2020/0116912 A1 | 4/2020 | Sharp | |
| 2020/0142276 A1 | 5/2020 | McGettigan | |
| 2020/0241305 A1 | 7/2020 | Ouderkirk | |
| 2020/0241312 A1 | 7/2020 | McGettigan | |
| 2020/0379155 A1 | 12/2020 | Sharp | |
| 2020/0409183 A1 | 12/2020 | Saylor | |
| 2021/0041711 A1 | 2/2021 | Sharp | |

\* cited by examiner

FIG. 1
PRIOR ART

FIG. 2
PRIOR ART

COLOR SWITCH FOR REDUCED COLOR CROSS-TALK

CROSS-REFERENCE TO RELATED APPLICATIONS

This application claims priority to U.S. Provisional Application No. 62/623,484, filed Jan. 29, 2018, the contents of which are incorporated herein by reference in its entirety.

BACKGROUND

It is now feasible to fabricate sensor arrays with a pitch in the sub-micron range; far below the diffraction limit. There can thus be (e.g.) 50-100 such sub-diffraction-limited (SDL) pixels within a diffraction limited spot under typical imaging situations. Optical and electrical crosstalk increase as image sensor devices approach the diffraction limit. This impacts SNR and the performance of conventional color filter arrays (CFA) used for color capture. The conventional Bayer pattern, shown in FIG. 1, includes half of the pixels being green pixels, equally spaced apart from each other with red and blue pixels in the gaps between the green pixels. The Bayer filter exhibits significant crosstalk for SDL pixels under these circumstances. For instance, the shared edge of a red and green filter subpixel can result in crosstalk that weakens the red-green opponent signal, where filters that share corners show relatively little crosstalk.

One way to reduce crosstalk is to create a black-matrix, or guard-bands around each RGB or CMY subpixel, with associated penalty in light efficiency. There are also proposals to create a similar approach but with a light efficient CFA. In one proposal, by Anzagira and Fossum, shown in FIG. 2, additive primary sub-pixels with otherwise shared edges are isolated from each other using subtractive primary sub-pixels (where the subtractive primary color is given by the sum of the bounding additive primary bands). For such designs, a full color pixel can consist of an array of, for example, 16 CFA sub-pixels.

It is against this background that the techniques described herein have been developed.

SUMMARY

Disclosed herein is an imaging system that includes an imaging sensor with an array of pixels, wherein the size of each pixel is less than a diffraction limit of the imaging system; a lens; and a color switch. The color switch includes a first polarizer and a second polarizer; a retarder stack filter positioned between the first and second polarizers; and an achromatic switch positioned between the first and second polarizers, wherein the achromatic switch can be modulated between a pair of polarization states that are orthogonal to each other.

The achromatic switch may include a liquid crystal switch. The liquid crystal switch may be driven by an electrical signal whose state determines a color state of the color switch. The color switch may switch between two states, a green state and a magenta state. Each pixel may have a plurality of color subpixels, wherein the subpixels are spatially distributed in each pixel so that red subpixels and blue subpixels are immediately adjacent to green subpixels. The imaging sensor may include a color filter array. The size of each pixel may be less than a micron.

Also disclosed is an imaging system that includes an imaging sensor with an array of pixels; a color filter with an array of color subpixels, the array of color subpixels being aligned with the array of pixels of the imaging sensor, the array of color subpixels including at least two different colors of subpixels, a first color of subpixels allowing light of a first color spectrum to pass therethrough and a second color of subpixels allowing light of a second color spectrum to pass therethrough; and a color switch that controls the color of light reaching each pixel in the imaging sensor, wherein the color switch includes at least two operational states, a first state that allows light of a third color spectrum to pass therethrough and a second state that allows light of a fourth color spectrum to pass therethrough. When the color switch is in the first state, light reaching the pixels of the imaging array that are aligned with the first color of pixels is maximized and light reaching the pixels of the imaging array that are aligned with the second color of pixels is minimized. When the color switch is in the second state, light reaching the pixels of the imaging array that are aligned with the second color of pixels is maximized and light reaching the pixels of the imaging array that are aligned with the first color of pixels is minimized.

The first color spectrum of the first color of subpixels may include a significant amount of light in green wavelengths and a minimal amount of light in red and blue wavelengths and the second color spectrum of the second color of subpixels includes a significant amount of light in red and blue wavelengths and a minimal amount of light in green wavelengths. The color filter array may be arranged into rows and columns of color subpixels, where adjacent subpixels in the same row are not of the same color and adjacent subpixels in the same column are not of the same color. The color switch may include a liquid crystal switch. The liquid crystal switch may be driven by an electrical signal whose state determines a color state of the color switch. The color switch may switch between two states, a green state and a magenta state.

Further disclosed herein is an imaging system that includes an imaging sensor with an array of pixels, wherein the size of each pixel is less than a micron; a lens; and a color switch. The color switch includes a first polarizer and a second polarizer; a retarder stack filter positioned between the first and second polarizers; and an achromatic switch positioned between the first and second polarizers, wherein the achromatic switch can be modulated between a pair of polarization states that are orthogonal to each other.

The achromatic switch may include a liquid crystal switch. The liquid crystal switch may be driven by an electrical signal whose state determines a color state of the color switch. The color switch may switch between two states, a green state and a magenta state. Each pixel may have a plurality of color subpixels, wherein the subpixels are spatially distributed in each pixel so that red subpixels and blue subpixels are immediately adjacent to green subpixels. The imaging sensor may include a color filter array. The size of each pixel may be less than a diffraction limit of the imaging system.

BRIEF DESCRIPTION OF THE FIGURES

Figures 1, 2:
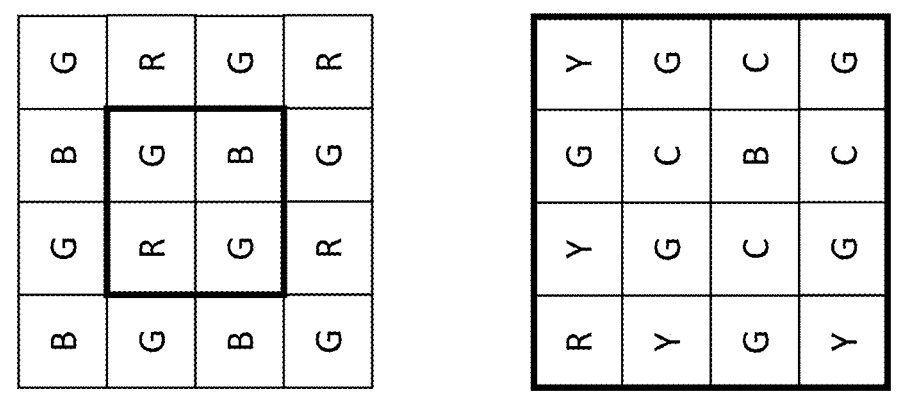

FIG. 1 shows a prior art Bayer color filter array.

FIG. 2 shows an alternative prior art color filter array.

DETAILED DESCRIPTION

Figure 3:
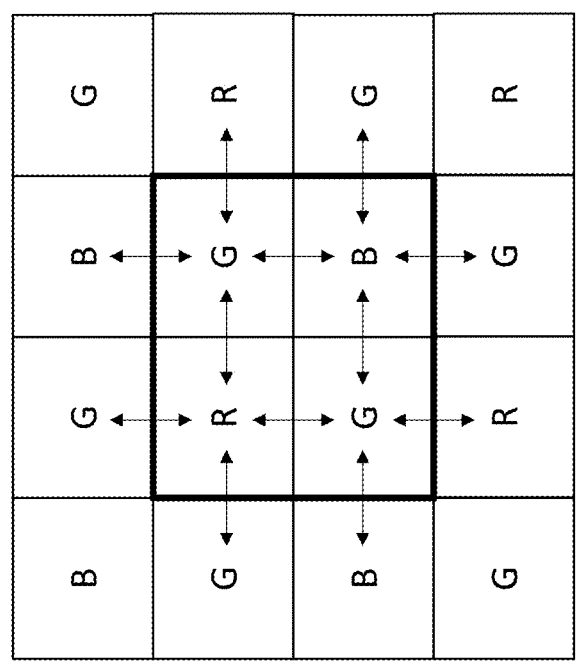
FIG. 3 shows the potential for cross-talk between adjacent pixels in the Bayer CFA.

While the embodiments disclosed herein are susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives of embodiments of the invention as defined by the claims. The disclosure is described with reference to the drawings, wherein like reference numbers denote substantially similar elements.

One of the benefits of new SDL sensor designs, such as the Quanta Image Sensor, is the potential for rapid field rate. This facilitates a time-sequential color acquisition (eliminating the need for a CFA), or a hybrid scheme using a CFA in combination with a color switching mechanism. The conventional approach is to use a filter wheel, which can be suitable for instrumentation, but not for (e.g.) compact consumer devices.

The techniques taught herein use, for example, a liquid-crystal based color switch in combination with an SDL sensor to facilitate high spatial resolution with low color cross-talk. An example of an LC switchable filter is described in U.S. Pat. No. 5,751,384 (incorporated herein by reference), which includes two stages. A first stage switches between a first additive primary color and the complementary subtractive primary color (e.g. blue/yellow), and the second stage switches between a second additive primary color and the complementary subtractive primary color (e.g. red/cyan). The product of the transmission of each stage produces a full-color switch.

The arrows of FIG. 3 illustrate the shared-edges that contribute most significantly to the color cross-talk of a prior-art Bayer pattern. In one embodiment, a single-stage color switch is used in combination with an SDL sensor containing a conventional CFA, showing a color pixel having 4 subpixels (2 green subpixels, 1 red subpixel, and 1 blue subpixel), surrounded by other subpixels, as shown in FIG. 3. The color switch is operated in a one-bit mode, switching between an additive primary color and the complementary subtractive primary color.

Figure 4:
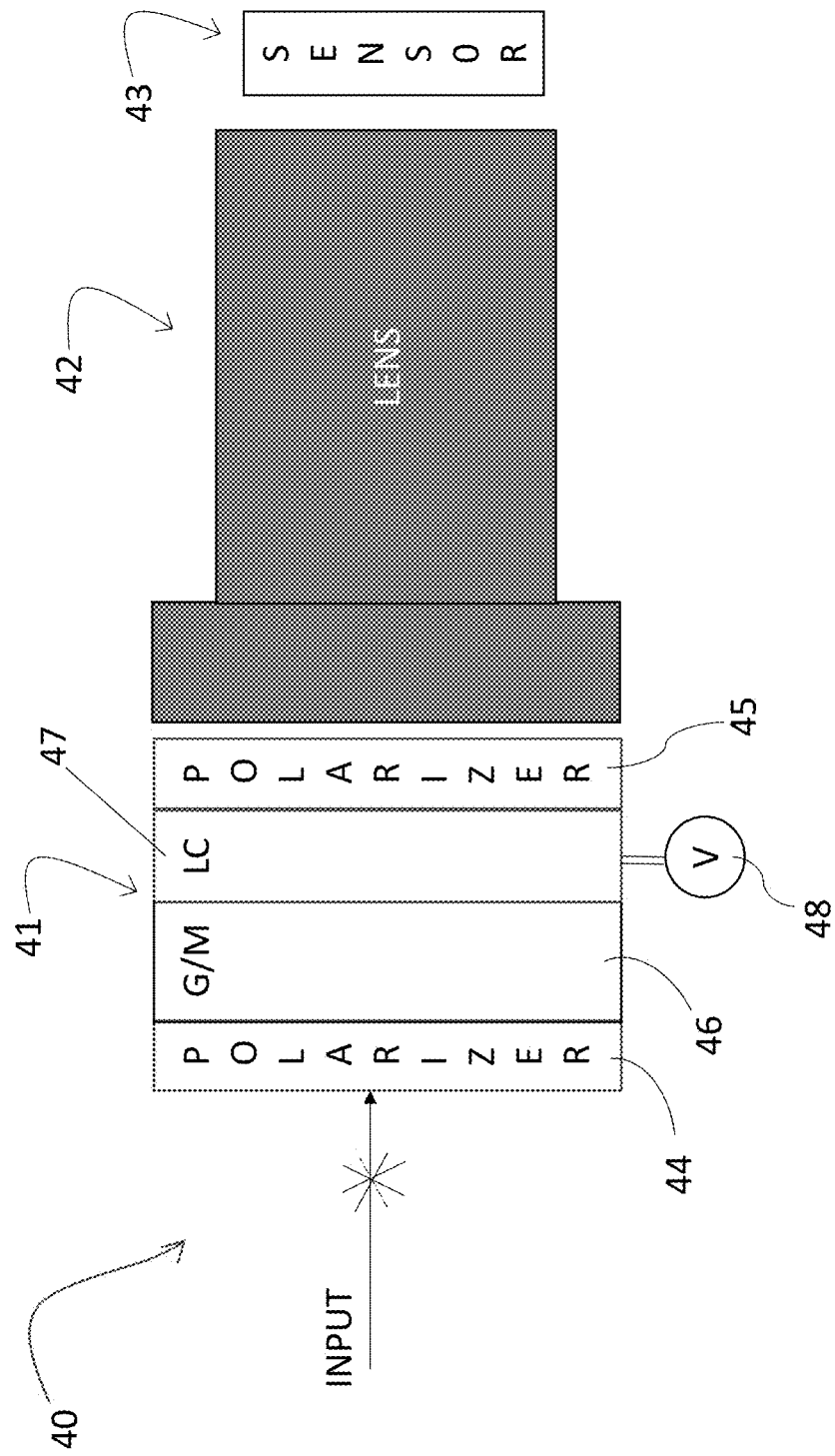
FIG. 4 shows an optical system with a two-state sequential color switch at the input of a camera lens.

FIG. 4 shows an optical system 40 with a two-state sequential color switch 41 at an input of a camera lens 42, which provides light to a sensor 43. The operation of the switch 41 is synchronized with the image capture of the sensor 43. The color switch 41 includes a pair of linear polarizers 44 and 45, a green/magenta retarder stack filter 46, and an achromatic liquid crystal switch 47 that can be modulated between orthogonal polarization states by electrical signals from a signal source 48.

Examples of the implementation of the retarder stack filter 46 are described in U.S. Pat. No. 5,751,384, and co-pending U.S. patent application Ser. No. 16/037,934 (US Patent Publication No. 2019/0018177, Wide-Angle Compensation Of Uniaxial Retarder Stacks), the entire contents of each of which are incorporated herein by reference. In one example, the linear polarizers 44 and 45 have absorption axes parallel to one-another. The retarder-stack 46 converts the SOP of light in the green spectral range to the orthogonal polarization, while preserving the input polarization for light in the blue and red spectral bands. In the absence of polarization switch 47, the second polarizer transmits magenta light while absorbing green light. The purpose of the polarization-switch is to effectively switch the orientation of the analyzing polarizer by 90°. For example, in a first voltage state 48, the polarization switch may appear effectively isotropic, transmitting all light with no change in the SOP. In a second voltage state, the polarization switch may switch the SOP of all incident light to the orthogonal SOP in transmission. In so doing, the analyzing polarizer may be effectively rotated by 90°, such that the spectrum of transmitted light is the inverse of that transmitted when the polarization switch is in the first voltage state. In the event that such complementary spectral switching is required over a broad range of incidence angles, structures that preserve normal-incidence behavior at large angles off-normal can be utilized. Such structures are described in co-pending U.S. patent application Ser. No. 16/037,934 (referenced above), which shows specific examples of green-magenta filters.

The polarization switch can be any electro-optic device that effectively switches the transmitted light between orthogonal states of polarization. Exemplary devices provide uniform polarization switching over an extended wavelength range (e.g. 420-680 nm), and over an extended range of incidence angles. Such liquid-crystal switches are described in co-pending U.S. patent application Ser. No. 16/195,618 (Self-Compensating LC Retardation Switch), the entire contents of which are incorporated herein by reference. The polarization switch is not limited to a liquid-crystal device and can be any device that provides the same switching function.

Figure 5:
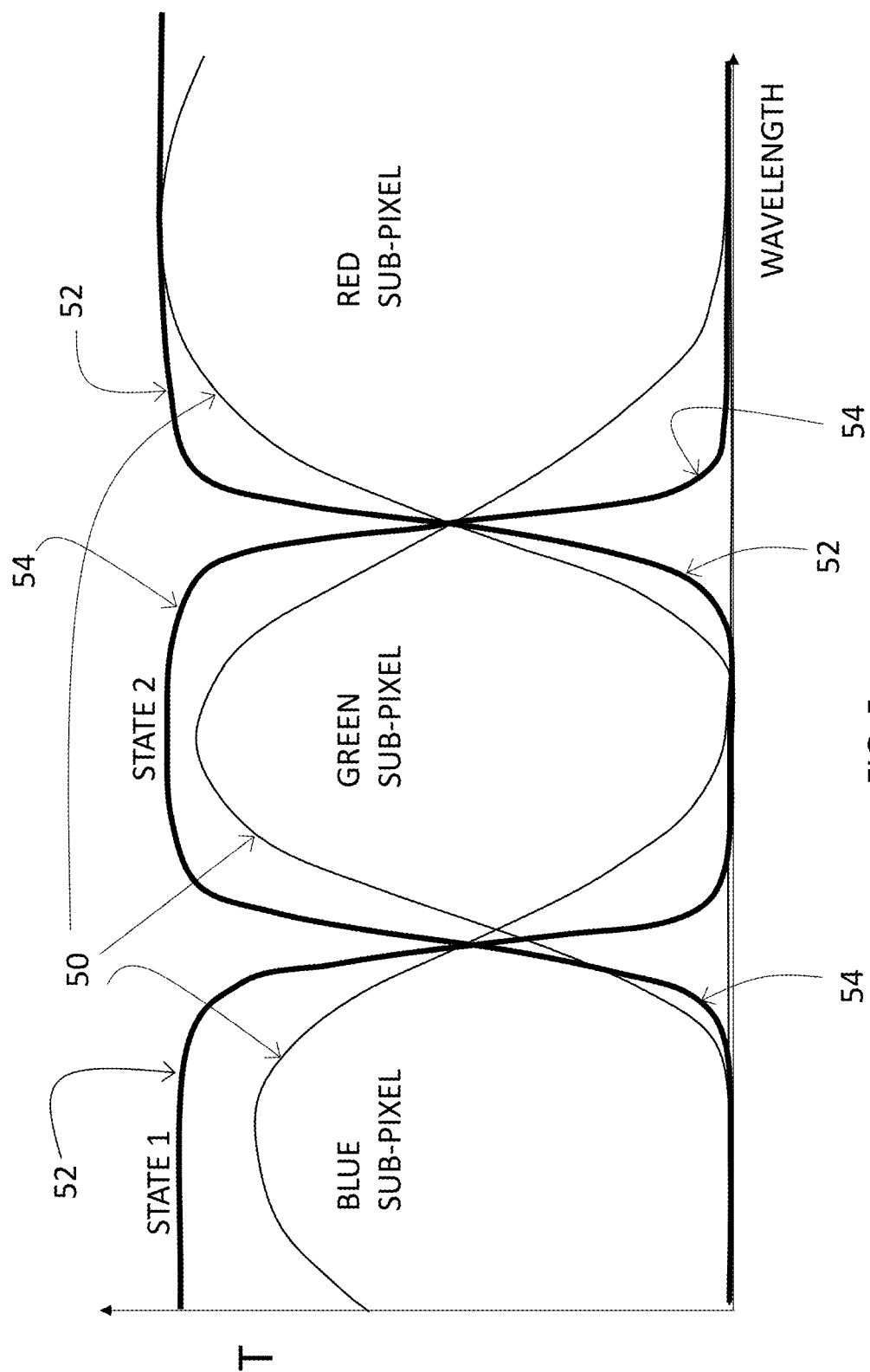
FIG. 5 shows the spectrum of a Bayer CFA superimposed with a green/magenta spectra of a two-state color switch.
Figure 6B:
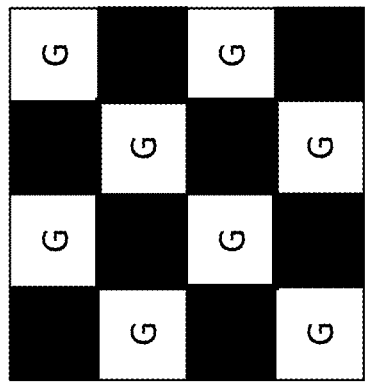
FIGS. 6a and 6b show a conventional Bayer pattern with the filter in a first state (magenta) and a second state (green), respectively.
Figure 6A:
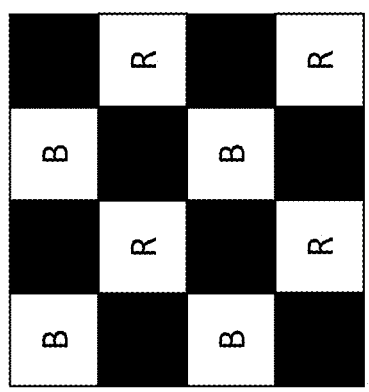

FIG. 5 shows the three transmission spectra 50 for the Bayer pattern, superimposed with the green/magenta (blue+red) transmission spectra associated with the color switch. For this pattern, each color pixel includes two green sub-pixels, one red subpixel and one blue subpixel. In the first state 52 of the filter, green light is blocked, giving the magenta spectrum of FIG. 5. With no green light incident, the green sub-pixels are effectively black, as illustrated in FIG. 6a. To the extent that the magenta filter fully blocks the green portion of the spectrum, any signal from a blue or red sub-pixel is the result of cross-talk. Because red and blue subpixels only share corners, the relative crosstalk should be low. In the second state 54 of the filter (the green output shown in FIG. 5), red and blue light are blocked, so the red and blue sub pixels are effectively black as shown in FIG. 6b. This allows capture of green information with low color crosstalk.

Using the hybrid approach, color crosstalk is greatly reduced, while permitting conventional CFA designs. While time sequential operation halves the light efficiency, it also enables smaller color pixels and thus higher spatial resolution. Conversely, the temporal efficiency loss can be recovered by maintaining the same spatial resolution for each full-color pixel (e.g. a Bayer color pixel sized the same as a more complex RGBCY pixel). Specifically, the Bayer pattern may allow larger sub-pixels relative to more complex CFA to achieve the same spatial resolution, and therefore improved light gathering.

For video applications, temporal artifacts can be mitigated by using a sensor with high field rate in conjunction with a rapidly switchable filter. LC devices can be switched at sub-millisecond speeds. Ferroelectric LC devices can be switched in tens of microseconds.

The filter device need not be polarization-based. For example, a Fabry-Perot resonator filter can be switched between (e.g.) transmission of green and magenta light via a device that switches between two phase states. An electro-optic phase shifter can change the refractive index, changing the cavity spacing, and thus the resonant wavelength(s) of the filter. Piezo devices can also be used to electrically change the cavity spacing.

Other rapidly switchable filter technologies are also possible using (e.g.) holographic polymer dispersed liquid crystal devices, surface plasmonic filters, use of metamaterials, and MEMS (micro electromechanical) devices. The switchable filter can be placed in the optical train anywhere between the scene to be captured and the sensor. The switchable filter may proceed the imaging lens, it may be mounted directly above the sensor, or it may be integrated into the imaging lens design.

The invention is not limited to color switching. The basic concept of a hybrid spatial/sequential spectral capture can be applied to light with wavelengths both shorter and longer than the visible band. For instance, multi-spectral capture that may include visible and near-infrared bands may benefit from the invention.

While the embodiments of the invention have been illustrated and described in detail in the drawings and foregoing description, such illustration and description are to be considered as examples and not restrictive in character. For example, certain embodiments described hereinabove may be combinable with other described embodiments and/or arranged in other ways (e.g., process elements may be performed in other sequences). Accordingly, it should be understood that only example embodiments and variants thereof have been shown and described.

We claim:

1. An imaging system, comprising:
   an imaging sensor with an array of pixels, wherein the size of each pixel is less than a diffraction limit of the imaging system, wherein the imaging sensor includes a color filter array;
   a lens; and
   a color switch that includes:
      a first polarizer and a second polarizer;
      a retarder stack filter positioned between the first and second polarizers; and
      an achromatic switch positioned between the first and second polarizers, wherein the achromatic switch is configured to be modulated between a first state that passes light of a first polarization orientation and a second state that passes light of a second polarization orientation, wherein the first and second polarization orientations are orthogonal to each other;
   wherein the color switch is operated in conjunction with the pixels of the imaging sensor together with the color filter array to minimize color cross-talk in image data collected by the imaging sensor.

2. An imaging system as defined in claim 1, wherein the achromatic switch includes a liquid crystal switch.

3. An imaging system as defined in claim 1, wherein the liquid crystal switch is driven by an electrical signal whose state determines a color state of the color switch.

4. An imaging system as defined in claim 1, wherein the color switch switches between two states, a green state and a magenta state.

5. An imaging system as defined in claim 1, wherein each pixel has a plurality of color subpixels, wherein the subpixels are spatially distributed in each pixel so that red subpixels and blue subpixels are immediately adjacent to green subpixels.

6. An imaging system as defined in claim 1, wherein the size of each pixel is less than a micron.

7. An imaging system, comprising:
   an imaging sensor with an array of pixels;
   a color filter with an array of color subpixels, the array of color subpixels being aligned with the array of pixels of the imaging sensor, the array of color subpixels including at least two different colors of subpixels, a first color of subpixels allowing light of a first color spectrum to pass therethrough and a second color of subpixels allowing light of a second color spectrum to pass therethrough; and
   a color switch that controls the color of light reaching each pixel in the imaging sensor, wherein the color switch includes at least two operational states, a first state that allows light of a third color spectrum to pass therethrough and a second state that allows light of a fourth color spectrum to pass therethrough;
   wherein when the color switch is in the first state, light reaching the pixels of the imaging array that are aligned with the first color of pixels is maximized and light reaching the pixels of the imaging array that are aligned with the second color of pixels is minimized; and
   wherein when the color switch is in the second state, light reaching the pixels of the imaging array that are aligned with the second color of pixels is maximized and light reaching the pixels of the imaging array that are aligned with the first color of pixels is minimized.

8. An imaging system as defined in claim 7, wherein the first color spectrum of the first color of subpixels includes a significant amount of light in green wavelengths and a minimal amount of light in red and blue wavelengths and the second color spectrum of the second color of subpixels includes a significant amount of light in red and blue wavelengths and a minimal amount of light in green wavelengths.

9. An imaging system as defined in claim 7, wherein the color filter array is arranged into rows and columns of color subpixels, where adjacent subpixels in the same row are not of the same color and adjacent subpixels in the same column are not of the same color.

10. An imaging system as defined in claim 7, wherein the color switch includes a liquid crystal switch.

11. An imaging system as defined in claim 10, wherein the liquid crystal switch is driven by an electrical signal whose state determines a color state of the color switch.

12. An imaging system as defined in claim 7, wherein the color switch switches between two states, a green state and a magenta state.

13. An imaging system, comprising:
   an imaging sensor with an array of pixels, wherein the size of each pixel is less than a micron, wherein the imaging sensor includes a color filter array;
   a lens; and
   a color switch that includes:
      a first polarizer and a second polarizer;
      a retarder stack filter positioned between the first and second polarizers; and
      an achromatic switch positioned between the first and second polarizers, wherein the achromatic switch is configured to be modulated between a first state that passes light of a first polarization orientation and a second state that passes light of a second polarization orientation, wherein the first and second polarization orientations are orthogonal to each other;
   wherein the color switch is operated in conjunction with the pixels of the imaging sensor together with the color filter array to minimize color cross-talk in image data collected by the imaging sensor.

14. An imaging system as defined in claim 13, wherein the achromatic switch includes a liquid crystal switch.

15. An imaging system as defined in claim 14, wherein the liquid crystal switch is driven by an electrical signal whose state determines a color state of the color switch.

16. An imaging system as defined in claim 13, wherein the color switch switches between two states, a green state and a magenta state.

17. An imaging system as defined in claim 13, wherein each pixel has a plurality of color subpixels, wherein the subpixels are spatially distributed in each pixel so that red subpixels and blue subpixels are immediately adjacent to green subpixels.

18. An imaging system as defined in claim 13, wherein the size of each pixel is less than a diffraction limit of the imaging system.

* * * * *